US012707733B2

(12) United States Patent
Lu

(10) Patent No.: US 12,707,733 B2
(45) Date of Patent: Aug. 11, 2026

(54) ARRAY SUBSTRATE AND DISPLAY PANEL

(71) Applicant: Shenzhen China Star Optoelectronics Semiconductor Display Technology Co., Ltd., Shenzhen (CN)

(72) Inventor: Zhitao Lu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 79 days.

(21) Appl. No.: 17/297,562

(22) PCT Filed: May 18, 2021

(86) PCT No.: PCT/CN2021/094410
§ 371 (c)(1),
(2) Date: Feb. 4, 2024

(87) PCT Pub. No.: WO2022/227136
PCT Pub. Date: Nov. 3, 2022

(65) Prior Publication Data

US 2024/0194699 A1 Jun. 13, 2024

(30) Foreign Application Priority Data

Apr. 28, 2021 (CN) ......................... 202110469516.0

(51) Int. Cl.
*G09G 3/36* (2006.01)
*H10F 39/10* (2025.01)

(52) U.S. Cl.
CPC ............. *H10F 39/103* (2025.01); *G09G 3/36* (2013.01); *G09G 2300/0408* (2013.01);
(Continued)

(58) Field of Classification Search
CPC ................... H10F 39/103; G09G 3/36; G09G 2300/0408; G09G 2300/0426;
(Continued)

(56) References Cited

U.S. PATENT DOCUMENTS 6,972,432 B1 12/2005 Furuya
9,182,643 B1 * 11/2015 Ge .................... G02F 1/136213
(Continued)

FOREIGN PATENT DOCUMENTS

CN 1607561 A 4/2005
CN 101452527 A 6/2009
(Continued)

OTHER PUBLICATIONS

International Search Report in International application No. PCT/CN2021/094410, mailed on Dec. 22, 2021.
(Continued)

*Primary Examiner* — Jonathan A Boyd
(74) *Attorney, Agent, or Firm* — Rivka Friedman

(57) ABSTRACT

The present application provides an array substrate and a display panel; the array substrate includes a display unit and a light sensing unit. A first electrode plate and a second electrode plate of a first capacitor of the light sensing unit are both transparent electrode plates, the first electrode plate is formed from a newly-added transparent conductive layer, the second electrode plate is served by a common electrode of the display unit, and the display unit and the light sensing unit work alternately in time-division within a time period of one frame to alleviate a problem of low aperture ratio in an existing display panel.

18 Claims, 3 Drawing Sheets

(52) U.S. Cl.
CPC ............... *G09G 2300/0426* (2013.01); *G09G 2300/0465* (2013.01); *G09G 2310/08* (2013.01); *G09G 2354/00* (2013.01); *G09G 2360/14* (2013.01)

(58) Field of Classification Search
CPC ....... G09G 2300/0465; G09G 2310/08; G09G 2354/00; G09G 2360/14; G02F 1/13338; G02F 1/13318; G02F 1/136213; G02F 1/13306; G02F 1/134309; H10D 86/441; H10D 86/481; H10D 86/60; H10D 86/451
See application file for complete search history.

(56) References Cited

U.S. PATENT DOCUMENTS

| | | | | |
|---|---|---|---|---|
| 2007/0109239 | A1* | 5/2007 | den Boer | G06F 3/0416 345/87 |
| 2008/0158461 | A1 | 7/2008 | Kenmochi et al. | |
| 2009/0206849 | A1 | 8/2009 | Chuang et al. | |
| 2010/0149089 | A1* | 6/2010 | Kim | G02F 1/13338 345/107 |
| 2014/0239159 | A1* | 8/2014 | Chen | G01J 1/4204 250/208.3 |
| 2015/0187854 | A1 | 7/2015 | Beak et al. | |
| 2016/0042216 | A1 | 2/2016 | Yang et al. | |
| 2019/0043420 | A1 | 2/2019 | Jung | |
| 2021/0066402 | A1 | 3/2021 | Pu et al. | |
| 2021/0135039 | A1* | 5/2021 | Jeon | H10F 39/011 |

FOREIGN PATENT DOCUMENTS

| | | | |
|---|---|---|---|
| CN | 104155785 | A | 11/2014 |
| CN | 104752637 | A | 7/2015 |
| CN | 110491886 | A | 11/2019 |
| CN | 111584577 | A | 8/2020 |
| CN | 111725242 | A | 9/2020 |
| CN | 111916464 | A | 11/2020 |
| CN | 112306304 | A | 2/2021 |
| CN | 112415798 | A | 2/2021 |
| JP | 2010262268 | A | 11/2010 |
| JP | 2011018053 | A | 1/2011 |
| JP | 2017227896 | A | 12/2017 |

OTHER PUBLICATIONS

Written Opinion of the International Search Authority in International application No. PCT/CN2021/094410, mailed on Dec. 22, 2021.
Chinese Office Action issued in corresponding Chinese Patent Application No. 202110469516.0 dated Jul. 4, 2022, pp. 1-8.
Korean Office Action issued in corresponding Korean Patent Application No. 10-2021-7020078 dated Jun. 21, 2022, pp. 1-3.
Japanese Office Action issued in corresponding Japanese Patent Application No. 102021-529050 dated Jul. 4, 2023, pp. 1-4.
European Office Action issued in corresponding European Patent Application No. 21730451.8 dated Feb. 3, 2025, pp. 1-8.

* cited by examiner

ARRAY SUBSTRATE AND DISPLAY PANEL

FIELD OF INVENTION

The present application relates to the field of display technology, and in particular to an array substrate and a display panel.

BACKGROUND

With development of display technology, remote interaction technology that integrates a light control sensor into a display panel and uses a laser as a control source has attracted people's attention. The light control sensor mainly includes a light-sensitive thin film transistor (TFT), a storage capacitor, etc. The light-sensitive thin film transistor generates a photocurrent after being exposed to light, and a storage capacitor is used to temporarily store an amount of electricity generated by the light-sensitive thin film transistor after the exposure. A size of the storage capacitor needs to be matched with the changed amount of electricity, and in order to match this amount of electricity, an area of the storage capacitor needs to be made relatively large. Meanwhile, due to opacity of the storage capacitor, a larger storage capacitor occupies a larger display area, which reduces an aperture ratio of the display panel.

Therefore, there is a need to solve the technical problem of low aperture ratio of the existing display panel.

SUMMARY OF INVENTION

Technical Problem

The present application provides an array substrate and a display panel to alleviate the technical problem of low aperture ratio in the existing display panel.

Technical Solution

In order to solve the above problem, the technical solutions provided by the present application are as follows:

An embodiment of the present application provides an array substrate, which includes a base substrate and a pixel circuit disposed on the base substrate, wherein the pixel circuit includes a driving circuit and a light sensing circuit, and the light sensing circuit includes a first transistor, a second transistor, and a first capacitor, wherein a gate of the first transistor is connected to a first control signal line, a first electrode of the first transistor is connected to a first power line, and a second electrode of the first transistor is connected to a first electrode of the second transistor;

wherein the first capacitor includes a first electrode plate and a second electrode plate, the first electrode plate is connected to the second electrode of the first transistor and the first electrode of the second transistor, and the second electrode plate is connected to a common voltage signal line; and wherein the first electrode plate and the second electrode plate are both transparent electrode plates, and the driving circuit and the light sensing circuit share the common voltage signal line.

In the array substrate provided by an embodiment of the present application, the light sensing circuit further includes a readout circuit, a second electrode of the second transistor is connected to the readout circuit, and a gate of the second transistor is connected to a second control signal line.

In the array substrate provided by an embodiment of the present application, the array substrate further includes a light sensing unit, the light sensing circuit is disposed in the light sensing unit, the first transistor and the second transistor are disposed in a same level, and the first capacitor is disposed at a side of the first transistor and the second transistor away from the base substrate.

In the array substrate provided by an embodiment of the present application, the array substrate further includes:

a first inorganic layer disposed on the side of the first transistor and the second transistor away from the base substrate;

a second inorganic layer disposed on a side of the first inorganic layer away from the first transistor and located between the first electrode plate and the second electrode plate.

In the array substrate provided by an embodiment of the present application, the array substrate further includes a display unit, the driving circuit is disposed in the display unit, and the display unit includes:

a third transistor disposed in the same level as the first transistor;

a pixel electrode disposed in a same level as the first electrode plate or the second electrode plate; and a common electrode also serving as the second electrode plate.

In the array substrate provided by an embodiment of the present application, the first electrode plate is disposed on the first inorganic layer, and the second electrode plate is disposed on the second inorganic layer.

In the array substrate provided by an embodiment of the present application, the second electrode plate is disposed on the first inorganic layer, and the first electrode plate is disposed on the second inorganic layer.

In the array substrate provided by an embodiment of the present application, the first electrode plate, the common electrode, and the pixel electrode are made of a same material.

In the array substrate provided by an embodiment of the present application, the array substrate further includes a display unit, the driving circuit is disposed in the display unit, and the display unit includes:

a third transistor disposed in the same level as the first transistor;

a pixel electrode disposed above the third transistor and electrically connected to the third transistor; and a common electrode also serving as the second electrode plate, wherein the pixel electrode is disposed in a level different from the first electrode plate and the second electrode plate.

In the array substrate provided by an embodiment of the present application, the common voltage signal line and the gate of the first transistor are disposed in a same level.

Another embodiment of the present application also provides a display panel, which includes an array substrate, the array substrate includes a base substrate and a pixel circuit disposed on the base substrate, the pixel circuit includes a driving circuit and a light sensing circuit, and the light sensing circuit includes a first transistor, a second transistor, and a first capacitor, wherein a gate of the first transistor is connected to a first control signal line, a first electrode of the first transistor is connected to a first power line, and a second electrode of the first transistor is connected to a first electrode of the second transistor;

wherein the first capacitor includes a first electrode plate and a second electrode plate, the first electrode plate is connected to the second electrode of the first transistor and the first electrode of the second transistor, and the second electrode plate is connected to a common voltage signal line; and wherein the first electrode plate and the second electrode plate are both transparent electrode plates, and the driving circuit and the light sensing circuit share the common voltage signal line.

In the display panel provided by the embodiment of the present application, the light sensing circuit further includes a readout circuit, a second electrode of the second transistor is connected to the readout circuit, and a gate of the second transistor is connected to a second control signal line.

In the display panel provided by the embodiment of the present application, the array substrate further includes a light sensing unit, the light sensing circuit is disposed in the light sensing unit, the first transistor and the second transistor are disposed in a same level, and the first capacitor is disposed at a side of the first transistor and the second transistor away from the base substrate.

In the display panel provided by the embodiment of the present application, the array substrate further includes:

a first inorganic layer disposed on the side of the first transistor and the second transistor away from the base substrate;

a second inorganic layer disposed on a side of the first inorganic layer away from the first transistor and located between the first electrode plate and the second electrode plate.

In the display panel provided by the embodiment of the present application, the array substrate further includes a display unit, the driving circuit is disposed in the display unit, and the display unit includes:

a third transistor disposed in the same level as the first transistor;

a pixel electrode disposed in a same level as the first electrode plate or the second electrode plate; and a common electrode also serving as the second electrode plate, wherein the display panel is time-divided into a display stage and a light sensing stage within a time period of one frame, the display unit is used to work in the display stage, and the light sensing unit is used to work in the light sensing stage.

In the display panel provided by the embodiment of the present application, the first electrode plate is disposed on the first inorganic layer, and the second electrode plate is disposed on the second inorganic layer.

In the display panel provided by the embodiment of the present application, the second electrode plate is disposed on the first inorganic layer, and the first electrode plate is disposed on the second inorganic layer.

In the display panel provided by the embodiment of the present application, the first electrode plate, the common electrode, and the pixel electrode are made of a same material.

In the display panel provided by the embodiment of the present application, the array substrate further includes a display unit, the driving circuit is disposed in the display unit, and the display unit includes:

a third transistor disposed in the same level as the first transistor;

a pixel electrode disposed above the third transistor and electrically connected to the third transistor; and a common electrode also serving as the second electrode plate, wherein the pixel electrode is disposed in a level different from the first electrode plate and the second electrode plate.

In the display panel provided by the embodiment of the present application, the common voltage signal line and the gate of the first transistor are disposed in a same level.

Advantageous Effect

The first electrode plate and the second electrode plate of the first capacitor in the array substrate and the display panel provided by the present application are both transparent electrode plates, the first electrode plate is formed from a newly-added transparent conductive layer, the second electrode plate is served by the common electrode of the display unit, and the display unit and the light sensing unit work alternately in a time-sharing manner within a time period of one frame, so that the first capacitor can transmit light without occupying additional display area and without impacting display of the display panel, thereby improving the aperture ratio and display effect of the display panel. Meanwhile, since the electrode plate of the first capacitor is a transparent electrode plate, it can be arranged in the display area without impacting the display, so a larger area of the first capacitor can be arranged, which improves the light sensing effect.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
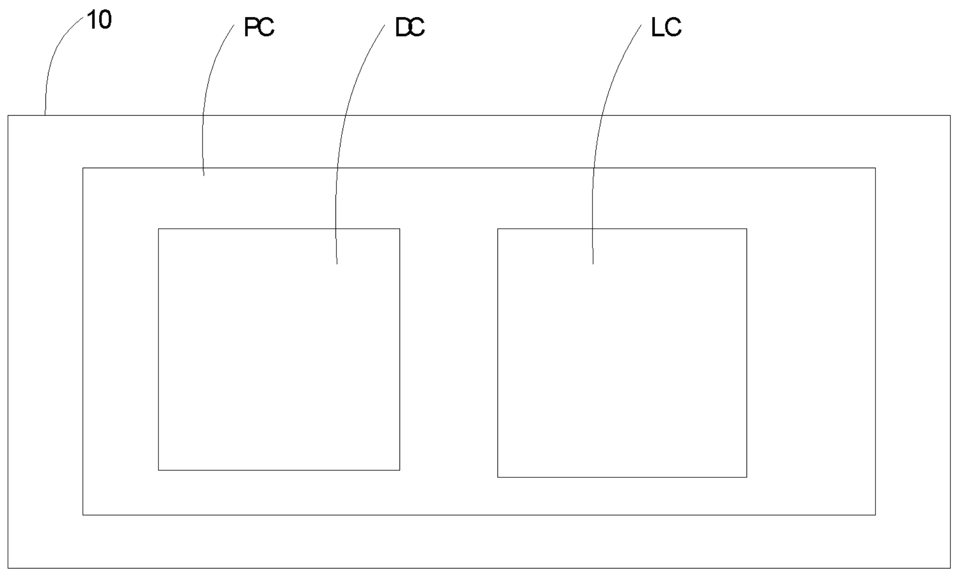
FIG. 1 is a schematic diagram of a frame structure of a pixel circuit provided by an embodiment of the present application.

The following description of the various embodiments is provided to illustrate the specific embodiments of the invention. Directional terms mentioned in the present invention, such as “vertical”, “horizontal”, “upper”, “bottom”, “pre”, "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals. In the drawings, the thickness of some layers and regions is exaggerated for clear understanding and ease of description. That is, the size and thickness of each component shown in the drawings are arbitrarily shown, but the application is not limited thereto.

Figure 2:
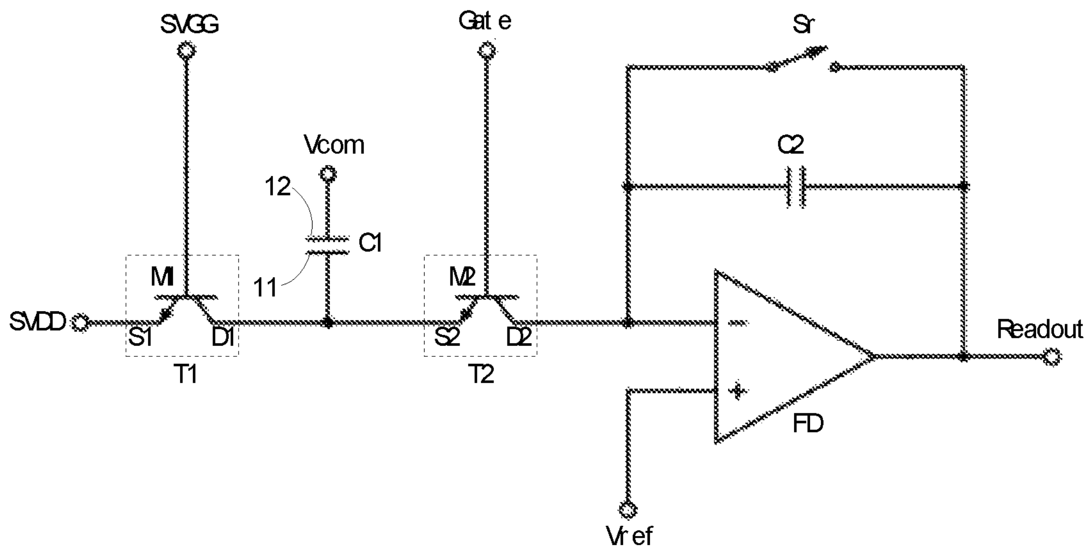
FIG. 2 is a schematic diagram of a circuit structure of a light sensing circuit provided by an embodiment of the present application.
Figure 3:
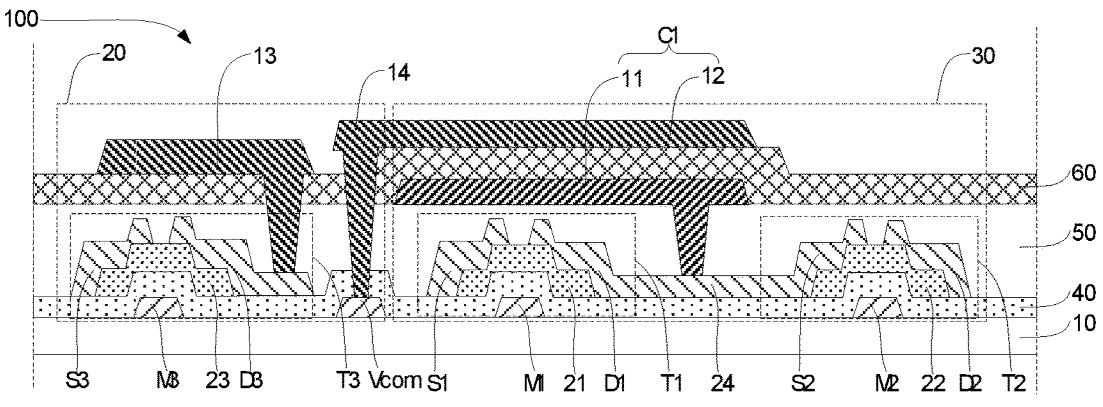
FIG. 3 is a schematic cross-sectional view of a first film structure of an array substrate provided by an embodiment of the present application.

Referring to FIG. 1 to FIG. 3, FIG. 1 is a schematic diagram of a frame structure of a pixel circuit provided by an embodiment of the present application, FIG. 2 is a schematic diagram of a circuit structure of a light sensing circuit provided by an embodiment of the present application, and FIG. 3 is a schematic cross-sectional view of a first film structure of an array substrate provided by an embodiment of the present application. The array substrate 100 includes a base substrate 10 and a pixel circuit PC disposed on the base substrate 10. The pixel circuit PC includes a driving circuit DC and a light sensing circuit LC. The array substrate 100 further includes a display unit 20 and a light sensing unit 30 disposed on the base substrate 10, and the driving circuit DC is disposed in the display unit 20 for driving pixels in the display unit 20 to display. The light-sensing circuit LC is disposed in the light-sensing unit 30, and is used to enable the light-sensing unit 30 to realize functions such as touch control, fingerprint recognition, and remote optical interaction by sensing changes in light intensity.

Optionally, the light sensing circuit LC includes a first transistor T1, a second transistor T2, and a first capacitor C1. A gate M1 of the first transistor T1 is connected to a first control signal line SVGG, a first electrode S1 of the first transistor T1 is connected to a first power line SVDD, and a second electrode D1 of the first transistor T1 is connected to a first electrode S2 of the second transistor T2. The first capacitor C1 includes a first electrode plate 11 and a second electrode plate 12, the first electrode plate 11 is connected to the second electrode D1 of the first transistor T1 and the first electrode S2 of the second transistor T2, and the second electrode plate 12 is connected to a common voltage signal line Vcom. The first electrode plate 11 and the second electrode plate 12 are both transparent electrode plates, and the driving circuit DC and the light sensing circuit LC share the common voltage signal line Vcom.

Further, the light sensing circuit LC further includes a readout circuit, the second electrode D2 of the second transistor T2 is connected to the readout circuit, and a gate M2 of the second transistor T2 is connected to a second control signal line Gate.

Optionally, the readout circuit includes an operational amplifier FD, a second capacitor C2, and a first switch Sr. The operational amplifier FD includes an inverting input terminal, a non-inverting input terminal, and an output terminal (wherein the inverting input terminal is marked by a symbol "–" and the non-inverting input terminal is marked by a symbol "+" in FIG. 2). The non-inverting input terminal is connected to a comparison voltage Vref, and the inverting input terminal is connected to the second electrode D2 of the second transistor T2. The second capacitor C2 and the first switch Sr are both connected to the operational amplifier FD in parallel. Specifically, one terminal of the second capacitor C2 and one terminal of the first switch Sr are both connected to the operational amplifier FD, and another terminal of the second capacitor C2 and another terminal of the first switch Sr are both connected to an output terminal of the operational amplifier FD. The output terminal of the operational amplifier FD is also connected to a readout line Readout, and the readout line Readout is used to output a light sensing signal.

It should be noted that the first electrode of the transistor of the present application can be a source of the transistor, and the second electrode of the transistor can be a drain of the transistor. For example, the first electrode S1 of the first transistor T1 is the source of the transistor T1, and the second electrode D1 of the first transistor T1 is the drain of the first transistor T1, but the present application is not limited thereto. In addition, in the present application, the first capacitor C1 is a storage capacitor, the second capacitor C2 is an integrating capacitor, the first transistor T1 is a phototransistor, and the second transistor T2 is a switching transistor.

The working process of the light sensing circuit LC includes: the first control signal line SVGG provides a voltage to the gate M1 of the first transistor T1, so that the first electrode S1 of the first transistor T1 and the second electrode D1 of the first transistor T1 are turned on, and a channel of the first transistor T1 generates a light-induced leakage current due to irradiation by light, and generates different degrees of leakage current according to an intensity of the light. An electrical signal of the first power supply line SVDD flows from the first electrode S1 of the first transistor T1 to the second electrode D1, reaches the first electrode plate 11 of the first capacitor C1, and changes due to the light-induced leakage current generated by the first transistor T1. The second electrode plate 12 of the first capacitor C1 is connected to the common voltage signal line Vcom, and meanwhile the first capacitor C1 is in a charged state, and the charged electrical signal includes light sensing information.

Meanwhile, the first electrode plate 11 of the first capacitor C1 is also connected to the first electrode S2 of the second transistor T2. When the second control signal line Gate provides a voltage to the gate M2 of the second transistor T2 to turn on the first electrode S2 and the second electrode D2 of the second transistor T2, a charge stored in the first capacitor C1 flows to the second electrode D2 of the second transistor T2 through the first electrode S2 of the second transistor T2, so that the first capacitor C1 discharges through the second transistor T2.

The second electrode D2 of the second transistor T2 is connected to the readout circuit, and the readout circuit receives the charge flowing out of the second electrode D2 of the second transistor T2 and converts the charge into a voltage signal for output.

Still referring to FIG. 3, the array substrate 100 includes a display unit 20 and a light sensing unit 30. The first transistor T1 and the second transistor T2 of the light sensing unit 30 are arranged in the same level, and the first capacitor C1 is arranged at a side of the first transistor T1 and the second transistor T2 away from the base substrate 10. The display unit 20 includes a third transistor T3, a pixel electrode 13, and a common electrode 14. The third transistor T3 is arranged in the same level as the first transistor T1 and the second transistor T2, and the pixel electrode 13 is arranged above the third transistor T3 and electrically connected to the third transistor T3, the common electrode 14 and the pixel electrode 13 are arranged in the same level, and the common electrode 14 also serves as the second electrode plate 12 of the first capacitor C1, that is, the pixel electrode 13 and the second electrode plate 12 of the first capacitor C1 are arranged in the same level.

Optionally, the base substrate 10 may be a rigid substrate or a flexible substrate; when the base substrate 10 is a rigid substrate, it may include a rigid substrate such as a glass substrate; and when the base substrate 10 is a flexible substrate, it may include a flexible substrate such as polyimide (PI) film, or ultra-thin glass film.

It should be noted that the first transistor T1, the second transistor T2, and the third transistor T3 are arranged in the same level, which means that in a preparation process of each of layers of the first transistor T1, the second transistor T2, and the third transistor T3, the layers formed of the same material are patterned to obtain at least two different features. For example, in this embodiment, the pixel electrode 13 and the common electrode 14 are obtained by patterning a same transparent conductive layer, so that the pixel electrode 13 and the common electrode 14 are provided in the same level.

Optionally, the array substrate 100 includes a first metal layer, a gate insulating layer 40, a semiconductor layer, and a second metal layer stacked on the base substrate 10 in sequence. The first metal layer is patterned to form the gate M1 of the first transistor T1, the gate M2 of the second transistor T2, the gate M3 of the third transistor T3, and the common voltage signal line Vcom. The semiconductor layer is patterned to form an active layer 21 of the first transistor T1, an active layer 22 of the second transistor T2, and an active layer 23 of the third transistor T3; and the second metal layer is patterned to form the first electrode S1 and the second electrode D1 of the first transistor T1, the first electrode S2 and the second electrode D2 of the second transistor T2, the first electrode S3 and the second electrode D3 of the third transistor T3, and a connection trace 24 for connecting the second electrode D1 of the first transistor T1 and the first electrode S2 of the second transistor T2.

It should be noted that the semiconductor layer and the second metal layer can be subjected to a photolithography process through the same photomask to simultaneously form the first electrode, the second electrode, the connection trace, and a pattern of the active layer of the transistor. Specifically, the semiconductor layer and the second metal layer are sequentially stacked and deposited on the gate insulating layer, then a half-tone mask (HTM) or gray tone mask (GTM) is used to perform a photolithography process on the semiconductor layer and the second metal layer, and a required pattern structure is formed through multiple exposure, development, and etching processes.

The first electrode S1 and the second electrode D1 of the first transistor T1 are in direct contact with the active layer 21 of the first transistor T1, there is a gap between the first electrode S1 and the second electrode D2 of the first transistor T1, and a portion of the active layer 21 corresponding to the gap is a channel of the first transistor T1. The first electrode S2 and the second electrode D2 of the second transistor T2 are in direct contact with the active layer 22 of the second transistor T2, there is a gap between the first electrode S2 and the second electrode D2 of the second transistor T2, and a portion of the active layer 22 corresponding to the gap is a channel of the second transistor T2. The first electrode S3 and the second electrode D3 of the third transistor T3 are in direct contact with the active layer 23 of the third transistor T3, and there is a gap between the first electrode S3 and the second electrode D3 of the third transistor T3, and a portion of the active layer 23 corresponding to the gap is a channel of the third transistor T3. Of course, parts of the first electrode and the second electrode of the transistor in contact with the active layer may also be provided with an ohmic contact layer to reduce impedance.

Further, the array substrate 100 further includes a first inorganic layer 50 and a second inorganic layer 60. The first inorganic layer 50 is disposed at a side of the first transistor T1 and the second transistor T2 away from the base substrate 10; and the second inorganic layer 60 is disposed on the side of the first inorganic layer 50 away from the first transistor T1 and is located between the first electrode plate 11 and the second electrode plate 12.

Specifically, the first inorganic layer 50 covers the first electrode S1 and the second electrode D1 of the first transistor T1 and the first electrode S2 and the second electrode D2 of the second transistor T2, and covers the gate insulating layer 40. The first inorganic layer 50 is patterned to form a first opening, and the first opening penetrates the first inorganic layer 50 to the connection trace 24 to expose a part of the connection trace 24. A material of the first inorganic layer 50 includes an inorganic material such as silicon oxide (SiOx), silicon nitride (SiNx), silicon oxynitride (SiNO), etc.

The first electrode plate 11 of the first capacitor C1 is disposed on the first inorganic layer 50, and the second electrode plate 12 of the first capacitor C1 is disposed on the second inorganic layer 60. Specifically, a first transparent conductive layer is provided on the first inorganic layer 50, and the first transparent conductive layer is patterned to form the first electrode plate 11 of the first capacitor C1, and the first electrode plate 11 is connected to the connection trace through a first via hole of the first inorganic layer 50, that is, the first electrode plate 11 is connected to the second electrode D1 of the first transistor T1 and the first electrode S2 of the second transistor T2. A material of the first transparent conductive layer includes a transparent conductive material such as indium tin oxide (ITO) and so on.

The second inorganic layer 60 covers the first electrode plate 11 and the first inorganic layer 50, and the second inorganic layer 60 is patterned to form a second opening and a third opening. The second opening penetrates the second inorganic layer 60, the first inorganic layer 50, and the gate insulating layer 40 to the common voltage signal line Vcom to expose a part of the common voltage signal line Vcom. The third opening penetrates through the second inorganic layer 60 and the first inorganic layer 50 to the second electrode D3 of the third transistor T3 to expose a part of the second electrode D3 of the third transistor T3. A material of the first inorganic layer 50 includes an inorganic material such as silicon oxide (SiOx), silicon nitride (SiNx), silicon oxynitride (SiNO), etc.

A second transparent conductive layer is provided on the second inorganic layer 60, the second transparent conductive layer is patterned to form the pixel electrode 13 and the common electrode 14 of the display unit 20, the common electrode 14 is connected to the common voltage signal line Vcom through a second via hole, and the common electrode 14 also serves as the second electrode plate 12 of the first capacitor C1, wherein the common voltage signal line Vcom provides a constant regulated voltage signal. The pixel electrode 13 is connected to the second electrode D3 of the third transistor T3 through a third via hole. A material of the second transparent conductive layer includes a transparent conductive material such as indium tin oxide (ITO) and so on.

In this embodiment, a separate transparent conductive film is added on the array substrate 100 as the first electrode plate 11 of the first capacitor C1 of the photosensitive unit 30, and the common electrode 14 of the display unit 20 also serves as the second electrode plate 12 of the first capacitor C1, so that the first capacitor C1 can transmit light without occupying additional area of the display area, and will not impact normal display of the display panel using the array substrate 100, thereby improving the aperture ratio and display effect of the display panel. Meanwhile, since the electrode plate of the first capacitor C1 is a transparent electrode plate, it can be arranged in the display area without impacting display, and therefore the first capacitor C1 having a larger area can be arranged, thus improving the light sensing effect.

Figure 4:
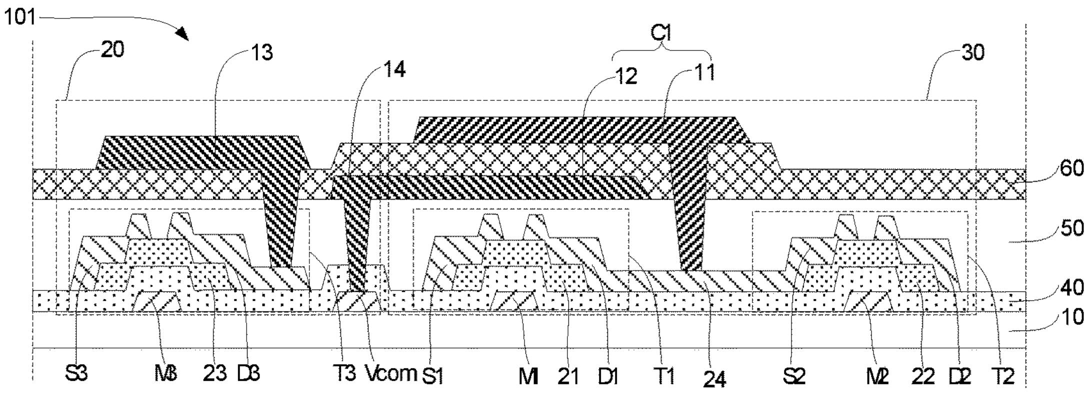
FIG. 4 is a schematic cross-sectional view of a second film structure of an array substrate provided by an embodiment of the present application.
Figure 5:
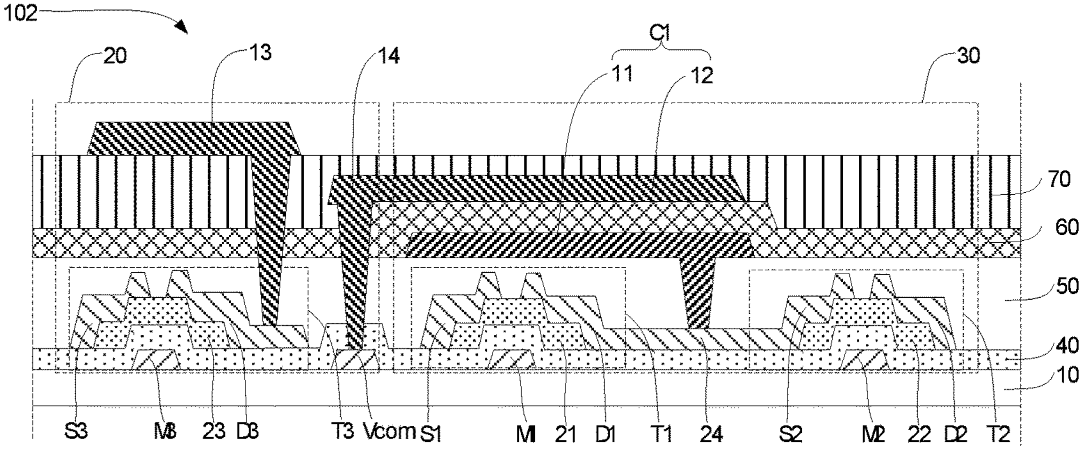
FIG. 5 is a schematic cross-sectional view of a third film structure of an array substrate provided by an embodiment of the present application.

In an embodiment, refer to FIG. 4, which is a schematic cross-sectional view of a second film structure of an array substrate provided by an embodiment of the present application. A difference from the foregoing embodiment is that in the light sensing unit 30 of the array substrate 101, the second electrode plate 12 of the first capacitor C1 is disposed on the first inorganic layer 50, and the first electrode plate 11 is disposed on the second inorganic layer 60. In addition, the pixel electrode 13 of the display unit 20 and the first electrode plate 11 of the first capacitor C1 are arranged in the same level, and the common electrode 14 also serves as the second electrode plate 12 of the first capacitor C1.

Specifically, the array substrate 100 further includes a third inorganic layer 70, the first electrode plate 11 of the first capacitor C1 is disposed on the first inorganic layer 50, the common electrode 14 is disposed on the second inorganic layer 60, the pixel electrode 13 is disposed on the third inorganic layer 70, and a material of the third inorganic layer 70 may be the same as a material of the first inorganic material and/or a material of the second inorganic layer 60. The common electrode 14 can be provided as a blanket electrode, so that more pixel electrodes 13 can be arranged to improve the resolution. Other descriptions can be referred to the above-mentioned embodiments, which will not be repeated herein for brevity.

Another embodiment of the present application also provides a display panel. The display panel includes the array substrate provided by one of the above embodiments, wherein the display panel is time-divided into a display stage and a light sensing stage within a time period of one frame, the display unit 20 is used to work in the display stage, and the light sensing unit 30 is used to work in the light sensing stage.

Figure 6:
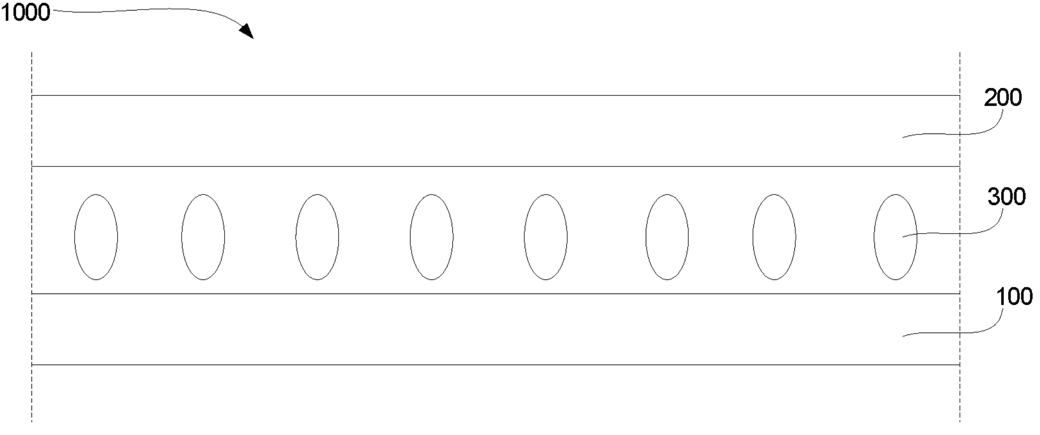
FIG. 6 is a schematic cross-sectional view of a display panel provided by an embodiment of the present application.
Figure 7:
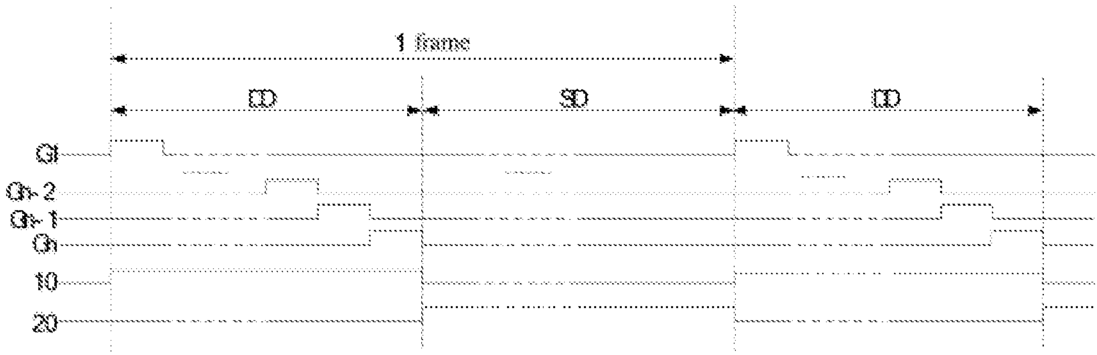
FIG. 7 is a schematic timing diagram of a time-sharing multiplexing of the display panel provided by an embodiment of the present application.

Specifically, referring to FIG. 3, FIG. 6, and FIG. 7, wherein FIG. 6 is a schematic cross-sectional view of a display panel provided by an embodiment of the present application, and FIG. 7 is a schematic timing diagram of a time-sharing multiplexing of a display panel provided by an embodiment of the present application. The display panel 1000 is a liquid crystal display (LCD) panel. The display panel 1000 includes an array substrate 100, a color filter substrate 200 disposed opposite to the array substrate 100, a color filter substrate 200 disposed on the array substrate 100 and the array substrate 100, and a liquid crystal layer 300 disposed between the color filter substrates 200.

Since the light sensing unit 30 is integrated on the array substrate 100, the display panel 1000 including the array substrate 100 can realize functions such as touch control, fingerprint recognition, and remote optical interaction, and meanwhile, the light sensing unit 30 is integrated into the display panel 1000, and an overall thickness of the display panel 1000 can also be reduced.

The light sensing unit 30 and the display unit 20 are integrated on the array substrate 100. In order not to impact the display of the display panel 1000, the display unit 20 and the light sensing unit 30 work alternately in a time-sharing manner within a time period of one frame. Specifically, referring to FIG. 7, the display panel 1000 is time-divided into a display phase DD and a light sensing phase SD within a time period of one frame. During the display phase DD, the gate scan lines sequentially provide scan signals (G1 to Gn−2, Gn−1, Gn, etc. in FIG. 7) to control the transistors of the display unit 20 to turn on and off, so as to realize the display function of the display panel 1000. In the light sensing stage SD, the gate scan lines stop scanning, and G1 to Gn−2, Gn−1, and Gn as shown in FIG. 7 are all set to low level in the light sensing stage DD to turn off the display function of the display panel 1000, so that the light sensing unit 30 works in the light sensing stage SD. As such, the display unit 20 and the light sensing unit 30 of the display panel 1000 can work alternately in a time-sharing manner within a time period of one frame, which can realize functions such as touch control, fingerprint recognition, and remote optical interaction of the display panel 1000 without impacting the normal display of the display panel 1000.

An embodiment of the present application also provides a display device, which includes the display panel provided by one of the foregoing embodiments, a device, such as a circuit board and so on, bound to the display panel, a cover plate covering the display panel, and the like. The display device includes an electronic equipment such as a mobile phone, a television, a notebook computer, etc.

According to the above embodiments:

The first electrode plate and the second electrode plate of the first capacitor in the array substrate and the display panel provided by the present application are both transparent electrode plates, the first electrode plate is formed from a newly-added transparent conductive layer, the second electrode plate is served by the common electrode of the display unit, and the display unit and the light sensing unit work alternately in a time-sharing manner within a time period of one frame, so that the first capacitor can transmit light without occupying additional display area and without impacting display of the display panel, thereby improving the aperture ratio and display effect of the display panel. Meanwhile, since the electrode plate of the first capacitor is a transparent electrode plate, it can be arranged in the display area without impacting the display, so a larger area of the first capacitor can be arranged, which improves the light sensing effect.

In the above embodiments, the descriptions of each embodiment have their own emphasis. The parts that are not described in detail in an embodiment can be referred to the detailed descriptions in other embodiments above, which will not be repeated herein for brevity.

The embodiments of the present application have been described in detail above. Specific examples are used in this text to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. An array substrate, comprising a base substrate and a pixel circuit disposed on the base substrate, wherein the pixel circuit comprises a driving circuit and a light sensing circuit, and the light sensing circuit comprises a first transistor, a second transistor, and a first capacitor, wherein a gate of the first transistor is connected to a first control signal line, a first electrode of the first transistor is connected to a first power line, and a second electrode of the first transistor is connected to a first electrode of the second transistor;

wherein the first capacitor comprises a first electrode plate and a second electrode plate, the first electrode plate is connected to the second electrode of the first transistor and the first electrode of the second transistor, and the second electrode plate is connected to a common voltage signal line;

wherein the first electrode plate and the second electrode plate are both transparent electrode plates, and the driving circuit and the light sensing circuit share the common voltage signal line; and wherein the common voltage signal line is entirely disposed in a same layer as the gate of the first transistor;

wherein an orthographic projection of the first capacitor on the base substrate entirely covers an orthographic projection of the first transistor on the base substrate.

2. The array substrate according to claim 1, wherein the light sensing circuit further comprises a readout circuit, a second electrode of the second transistor is connected to the readout circuit, and a gate of the second transistor is connected to a second control signal line.

3. The array substrate according to claim 1, wherein the array substrate further comprises a light sensing unit, the light sensing circuit is disposed in the light sensing unit, the first transistor and the second transistor are disposed in a same layer, and the first capacitor is disposed at a side of the first transistor and the second transistor, wherein the side is farther away from the base substrate than a further side of the first transistor and the second transistor.

4. The array substrate according to claim 3, wherein the array substrate further comprises:

a first inorganic layer disposed on the side of the first transistor and the second transistor; and a second inorganic layer disposed on a side of the first inorganic layer away from the first transistor and located between the first electrode plate and the second electrode plate.

5. The array substrate according to claim 4, wherein the array substrate further comprises a display unit, the driving circuit is disposed in the display unit, and the display unit comprises:

a third transistor disposed in the same layer as the first transistor;

a pixel electrode disposed in a same layer as the first electrode plate or the second electrode plate; and a common electrode also serving as the second electrode plate.

6. The array substrate according to claim 5, wherein the first electrode plate is disposed on the first inorganic layer, and the second electrode plate is disposed on the second inorganic layer.

7. The array substrate according to claim 5, wherein the second electrode plate is disposed on the first inorganic layer, and the first electrode plate is disposed on the second inorganic layer.

8. The array substrate according to claim 5, wherein the first electrode plate, the common electrode, and the pixel electrode are made of a same material.

9. The array substrate according to claim 4, wherein the array substrate further comprises a display unit, the driving circuit is disposed in the display unit, and the display unit comprises:

a third transistor disposed in the same layer as the first transistor;

a pixel electrode disposed above the third transistor and electrically connected to the third transistor; and a common electrode also serving as the second electrode plate, wherein the pixel electrode is disposed in a layer different from the first electrode plate and the second electrode plate.

10. A display panel, comprising an array substrate, wherein the array substrate comprises a base substrate and a pixel circuit disposed on the base substrate, the pixel circuit comprises a driving circuit and a light sensing circuit, and the light sensing circuit comprises a first transistor, a second transistor, and a first capacitor, wherein a gate of the first transistor is connected to a first control signal line, a first electrode of the first transistor is connected to a first power line, and a second electrode of the first transistor is connected to a first electrode of the second transistor;

wherein the first capacitor comprises a first electrode plate and a second electrode plate, the first electrode plate is connected to the second electrode of the first transistor and the first electrode of the second transistor, and the second electrode plate is connected to a common voltage signal line;

wherein the first electrode plate and the second electrode plate are both transparent electrode plates, and the driving circuit and the light sensing circuit share the common voltage signal line; and wherein the common voltage signal line is entirely disposed in a same layer as the gate of the first transistor;

wherein an orthographic projection of the first capacitor on the base substrate entirely covers an orthographic projection of the first transistor on the base substrate.

11. The display panel according to claim 10, wherein the light sensing circuit further comprises a readout circuit, a second electrode of the second transistor is connected to the readout circuit, and a gate of the second transistor is connected to a second control signal line.

12. The display panel according to claim 10, wherein the array substrate further comprises a light sensing unit, the light sensing circuit is disposed in the light sensing unit, the first transistor and the second transistor are disposed in a same layer, and the first capacitor is disposed at a side of the first transistor and the second transistor, wherein the side is farther away from the base substrate than a further side of the first transistor and the second transistor.

13. The display panel according to claim 12, wherein the array substrate further comprises:

a first inorganic layer disposed on the side of the first transistor and the second transistor; and a second inorganic layer disposed on a side of the first inorganic layer away from the first transistor and located between the first electrode plate and the second electrode plate.

14. The display panel according to claim 13, wherein the array substrate further comprises a display unit, the driving circuit is disposed in the display unit, and the display unit comprises:

a third transistor disposed in the same layer as the first transistor;

a pixel electrode disposed in a same layer as the first electrode plate or the second electrode plate; and a common electrode also serving as the second electrode plate, wherein the display panel is time-divided into a display stage and a light sensing stage within one frame time, the display unit is used to work in the display stage, and the light sensing unit is used to work in the light sensing stage.

15. The display panel according to claim 14, wherein the first electrode plate is disposed on the first inorganic layer, and the second electrode plate is disposed on the second inorganic layer.

16. The display panel according to claim 14, wherein the second electrode plate is disposed on the first inorganic layer, and the first electrode plate is disposed on the second inorganic layer.

17. The display panel according to claim 14, wherein the first electrode plate, the common electrode, and the pixel electrode are made of a same material.

18. The display panel according to claim 13, wherein the array substrate further comprises a display unit, the driving circuit is disposed in the display unit, and the display unit comprises:

a third transistor disposed in the same layer as the first transistor;

a pixel electrode disposed above the third transistor and electrically connected to the third transistor; and a common electrode also serving as the second electrode plate, wherein the pixel electrode is disposed in a layer different from the first electrode plate and the second electrode plate.

* * * * *